United States Patent
Zhang et al.

(10) Patent No.: US 10,262,892 B2
(45) Date of Patent: Apr. 16, 2019

(54) SKIP VIA STRUCTURES

(71) Applicant: GLOBALFOUNDRIES INC., Grand Cayman (KY)

(72) Inventors: Xunyuan Zhang, Albany, NY (US); Frank W. Mont, Troy, NY (US); Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/345,882

(22) Filed: Nov. 8, 2016

(65) Prior Publication Data
US 2018/0130699 A1 May 10, 2018

(51) Int. Cl.
| | | |
|---|---|---|
| *H01L 21/768* | (2006.01) | |
| *H01L 23/522* | (2006.01) | |
| *H01L 23/528* | (2006.01) | |
| *H01L 23/532* | (2006.01) | |

(52) U.S. Cl.
CPC .. *H01L 21/76813* (2013.01); *H01L 21/76808* (2013.01); *H01L 21/76877* (2013.01); *H01L 23/5226* (2013.01); *H01L 23/5283* (2013.01); *H01L 23/53209* (2013.01); *H01L 23/53257* (2013.01)

(58) Field of Classification Search
CPC ......... H01L 21/76808; H01L 21/76877; H01L 23/5226; H01L 23/5283
See application file for complete search history.

(56) References Cited

U.S. PATENT DOCUMENTS

| | | | |
|---|---|---|---|
| 2006/0216929 A1 | 9/2006 | Park et al. | |
| 2012/0104622 A1* | 5/2012 | Kim | H01L 21/76804 257/774 |
| 2016/0071803 A1* | 3/2016 | Saito | H01L 23/53276 257/746 |

OTHER PUBLICATIONS

Taiwanese Office Action and Search Report in related TW Application No. 106105274 dated Dec. 10, 2019, 11 pages.

* cited by examiner

*Primary Examiner* — Marc Anthony Armand
(74) *Attorney, Agent, or Firm* — Anthony Canale; Andrew M. Calderon; Roberts Mlotkowski Safran Cole & Calderon P.C.

(57) ABSTRACT

The present disclosure relates to semiconductor structures and, more particularly, to skip via structures and methods of manufacture. The structure includes: a first wiring layer with one or more wiring structures; a second wiring layer with one or more wiring structures, located above the first wiring layer; a skip via with metallization, which passes through upper wiring levels including the second wiring layer and which makes contact with the one or more wiring structures of the first wiring layer; and a via structure which comprises a protective material and contacts at least one of the one or more wiring structures at the upper wiring level.

19 Claims, 3 Drawing Sheets

SKIP VIA STRUCTURES

FIELD OF THE INVENTION

The present disclosure relates to semiconductor structures and, more particularly, to skip via structures and methods of manufacture.

BACKGROUND

A via is an electrical connection between wiring structure (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a skip via can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using skip vias. For example, in the manufacturing process, the skip via will land on a wiring structure in a lower level (e.g., M0 level), while the regular via will land on the wiring structure in an upper level (e.g., M1 or above level). Due to the skip via etching processes, though, damage will result at the interface between the wiring structure in the upper level and a via interconnect structure. That is, due to the different etch depths, the skip via etching process will result in surface damage to the upper wiring structure, e.g., copper material. This damage causes higher resistivity which, in turn, decreases device performance.

SUMMARY

In an aspect of the disclosure, a structure comprises: a first wiring layer with one or more wiring structures; a second wiring layer with one or more wiring structures, located above the first wiring layer; a skip via with metallization, which passes through upper wiring levels including the second wiring layer and which makes contact with the one or more wiring structures of the first wiring layer; and a via structure which comprises a protective material and contacts at least one of the one or more wiring structures at the upper wiring level.

In an aspect of the disclosure, a method comprises: forming a via to expose one or more wiring structures of an upper wiring layer; forming a protective material in the via to mask the exposed one or more wiring structures of the upper wiring layer; and forming a skip via which passes through the upper wiring layer and which exposes one or more wiring structures of a lower wiring layer, while the protective material protects the exposed one or more wiring structures of the upper wiring layer.

In an aspect of the disclosure, a method, comprises: forming a wiring layer with one or more wiring structures in a lower wiring layer; forming a wiring layer with one or more wiring structures in an upper wiring layer, located above the lower wiring layer; forming a via to expose the one or more wiring structures of the upper wiring layer and a via which passes through the upper wiring layer and which lands above the lower wiring layer; forming a protective material in the via to mask the exposed one or more wiring structures of the upper wiring layer; extending the via landing on the lower wiring layer to forming a skip via exposing the one or more wiring structures of the lower wiring layer, while the protective material protects the exposed one or more wiring structures of the upper wiring layer; and filling at least the skip via with conductive material to contact the one or more wiring structure of the lower wiring layer and in electrical connection with the one or more wiring structures of the upper wiring layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to skip via structures and methods of manufacture. More specifically, the present disclosure provides manufacturing processes and resultant skip via structures which solve unequal via etch time issues of upper level via formation, e.g., damage from occurring to an upper wiring layer during skip via etching processes. Accordingly and advantageously, the manufacturing processes and resultant skip via structures will not result in damage to an upper wiring structure due to any difference of via etch depth. In other words, the methods provided herein will not result in an over etch of copper or other metallization material at the upper wiring level (e.g., M1 level) during skip via formation.

In embodiments, the processes described herein provide a protective material over an exposed surface of an upper wiring structure (e.g., M1 level) during the skip via etching process. In embodiments, the protective material can be a sacrificial plug material formed in a via to protect an exposed surface of the upper wiring structure. That is, the sacrificial plug will serve as a mask to protect the upper wiring structure during skip via etching processes. In embodiments, the sacrificial plug can be removed after skip via formation, followed by conventional metallization processes to form the interconnect structures for both regular via fill and skip via fill. The processes described herein are advantageous for all technology nodes and particularly for 7 nm and beyond technologies.

The skip via structures of the present disclosure can be manufactured in a number of ways using a number of different tools. In general, though, the methodologies and tools are used to form structures with dimensions in the micrometer and nanometer scale. The methodologies, i.e., technologies, employed to manufacture the skip via structures of the present disclosure have been adopted from integrated circuit (IC) technology. For example, the structures are built on wafers and are realized in films of material patterned by photolithographic processes on the top of a wafer. In particular, the fabrication of the skip via structures uses three basic building blocks: (i) deposition of thin films of material on a substrate, (ii) applying a patterned mask on top of the films by photolithographic imaging, and (iii) etching the films selectively to the mask.

Figure 1:
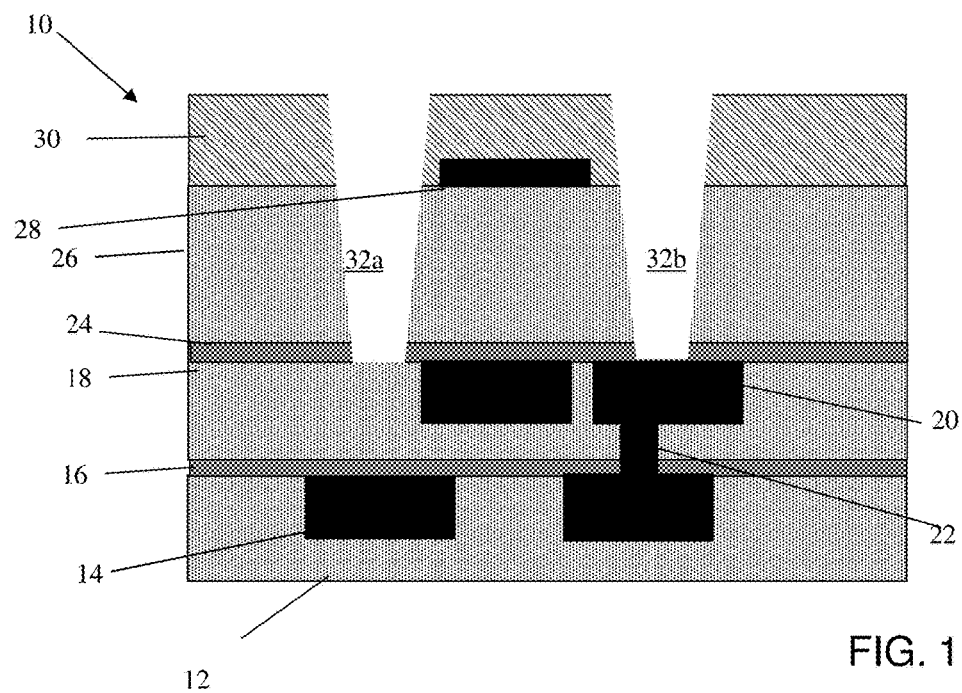
FIG. 1 shows a structure and respective fabrication processes in accordance with aspects of the present disclosure.

FIG. 1 shows a structure and respective fabrication processes in accordance with aspects of the present disclosure. In particular, the structure 10 includes a plurality of wiring levels, e.g., M0, M1, etc., in a die. For example, the structure 10 includes wiring structures 14 provided in an insulator material 12. As should be understood by those of skill in the art, the wiring structures 14 in the insulator material 12 are lower wiring structures, designated representatively at an M0 level; although the wiring structures 14 can be provided at any lower level of the structure. In embodiments, the insulator material 14 is an oxide, e.g., interlevel dielectric material, which can be deposited by a conventional deposition method, e.g., chemical vapor deposition (CVD). The wiring structures 14 can be composed of any conductive material such as, e.g., copper, tungsten, aluminum, etc.

The wiring structures 14 can be formed by conventional lithography, etching and deposition methods known to those of skill in the art. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known stripants. Following the resist removal, conductive material can be deposited in the one or more trenches by any conventional deposition processes, e.g., chemical vapor deposition (CVD) processes. Any residual material 14 on the surface of the insulator material 12 can be removed by conventional chemical mechanical polishing (CMP) processes.

Following the CMP process, a capping layer 16 is formed on the wiring structures 14 and insulator material 12. In embodiments, the capping layer 16 can be a diffusion barrier layer, e.g., copper diffusion barrier layer, which prevents copper or other metallization diffusion to an upper insulator layer 18 as well as oxygen diffusion to the wiring structures 14.

Still referring to FIG. 1, wiring structures 20 and via interconnect structures 22 are formed in the upper insulator layer 18. In embodiments, the wiring structures 20 and the interconnect structures 22 can be formed in any wiring layer above that of the wiring structures 14. Accordingly, the wiring structures 20 in the insulator material 18 are upper wiring structures, designated at an M1, M2, etc. level. The wiring structures 20 and the interconnect structures 22 can be formed using conventional lithography, etching and deposition, similar to that which was discussed with respect to the formation of the lower wiring structures 14. The wiring structures 20 and the via interconnect structures 22 can be composed of any conductive material such as, e.g., copper, tungsten, aluminum, etc. Following a CMP process to remove any residual material from the surface of the insulator material 18, a capping layer 24 is formed on the wiring structures 20 and insulator material 18. In embodiments, the capping layer 24 can be a diffusion barrier layer, e.g., copper diffusion barrier layer, as described above.

A masking material 28 is formed on the surface of the insulator material 18, between edges of selected wiring structures 20 on the M1 level and wiring structures 14 on the M0 level. The masking material 28 can be TiN, deposited and patterned by conventional deposition and etching processes, e.g., RIE. A resist is formed on the masking material 28 and insulator material 18, which is exposed to energy (light) to form a pattern (openings) in alignment with one or more wiring structures 14, 22 at the M0, M1 levels, respectively. An etching process with a selective chemistry, e.g., RIE, will be used to form one or more vias 32a, 32b in the insulator material 18 and capping layer 24, through the openings of the resist. The etching process is timed to stop at a depth in which a surface of the upper wiring structure 20 is exposed by the via 32b. In this way, the via 32b will be at a depth which lands on an exposes a surface of the wiring structure 20 on the M1 level, whereas, the via will land on the lower wiring layer (passing through the upper wiring layer, e.g., M1 level).

Figure 2:
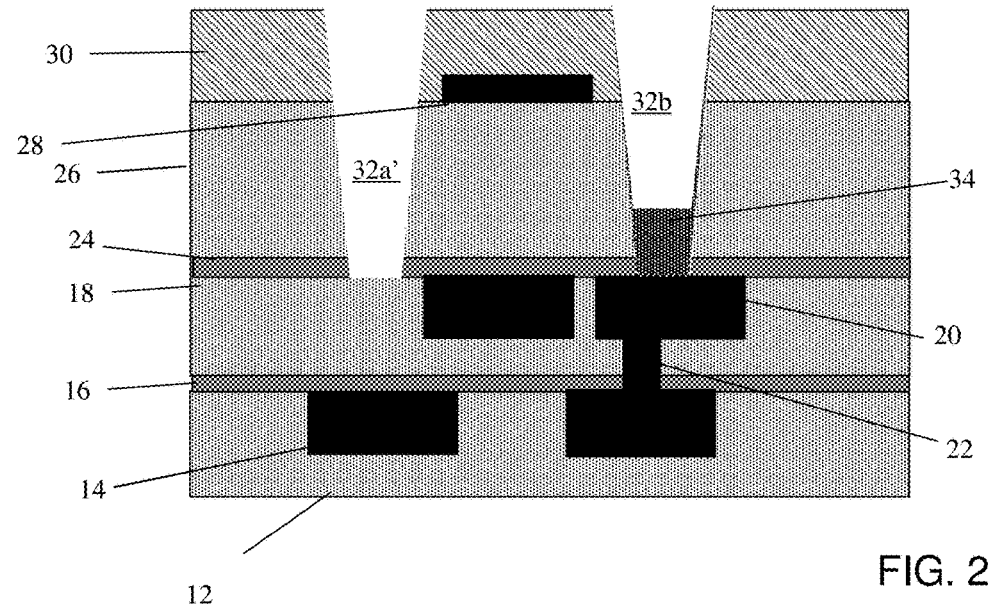
FIG. 2 shows a protective layer (e.g., sacrificial plug) formed in a trench, amongst other features, and respective fabrication processes in accordance with aspects of the present disclosure.

In FIG. 2, a protective layer (e.g., sacrificial plug) 34 is formed in the via 32b, directly over and/or on the surface of the upper wiring structure 20. In embodiments, the protective layer 34 can be cobalt, ruthenium or other protective material that can be selectively grown on the exposed surface of the wiring structure 20. In embodiments, the protective layer 34 can be deposited by an electroless process to a thickness of about 10 nm to about 30 nm; although other dimensions are also contemplated for use with the masking material.

Figure 3:
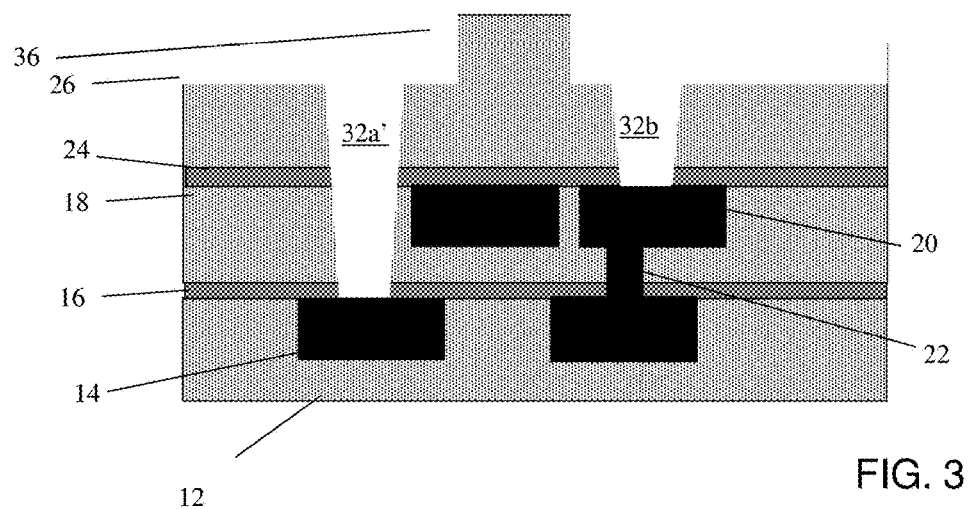
FIG. 3 shows a skip via structure, amongst other features, and respective fabrication processes in accordance with aspects of the present disclosure.

In FIG. 3, a skip via etching process continues through the upper levels (e.g., M1 level) to the wiring structure 14 on a lower level of the structure, e.g., M0 level. In embodiments, the skip via etch extends (deepens) the via 32a', landing on the wiring structure 14 on the lower level. During this skip via etching process, the protective layer (e.g., sacrificial plug) 34 will protect (mask) the surface of the wiring structure 20 on the upper level (above the wiring structure 14) from damage which may be caused by the etch chemistries used in the skip via etching process. The resist can then be removed by a conventional oxygen ashing process or other known stripants, followed by a trench RIE to form a trench 36 (of an upper level, e.g., level M2) and then removal of the masking material 28 by wet processes. The protective layer (e.g., sacrificial plug) 34 will also protect the surface of the wiring structure 20 on the M1 level during the removal of the masking material.

Still referring to FIG. 3, after the removal of the masking material 28, the protective layer (e.g., sacrificial plug) 34 on the surface of the wiring structure 20 on the M1 level is removed. For example, a wet process with a selective chemistry can be used to remove the protective layer (e.g., sacrificial plug) 34.

Figure 4:
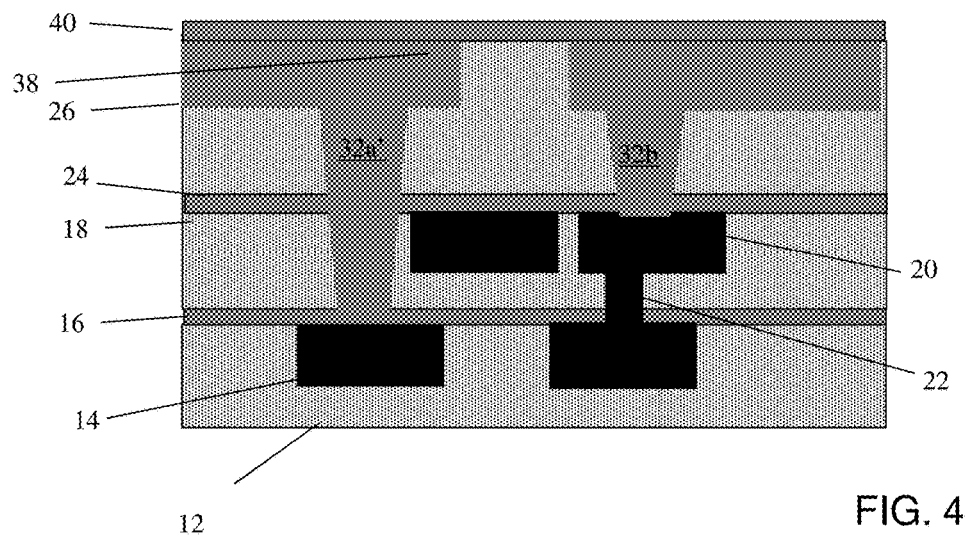
FIG. 4 shows metallization in the skip via structure and regular via structure, amongst other features, and respective fabrication processes in accordance with aspects of the present disclosure.

As shown in FIG. 4, the vias 32a' and 32b and trench 36 are filled with conductive material 38 to form dual damascene structures, e.g., interconnect structures and upper wiring structures. It should be understood by those of skill in the art that the interconnect structure formed in the via 32a' will be a skip via structure, electrically and directly connecting to wiring structure 14 on the M0 level, e.g., bypassing any connections in the M1 or above level. The conductive material 38 in the via 32b, on the other hand, will be a regular via interconnect structure, providing electrical and direct connection to the wiring structure 20 on the lower level. In embodiments, the metal material can be copper, aluminum, tungsten, etc., to name a few contemplated materials. The conductive material 38 can be deposited by a conventional deposition method, e.g., CVD and/or plasma vapor deposition (PVD) and/or atomic layer deposition (ALD), followed by a conventional planarization process, e.g., CMP, to remove any residual material on the insulator layer 26. A capping layer 40 can then be formed over the insulator layer 26 and conductive material 38.

Figure 5:
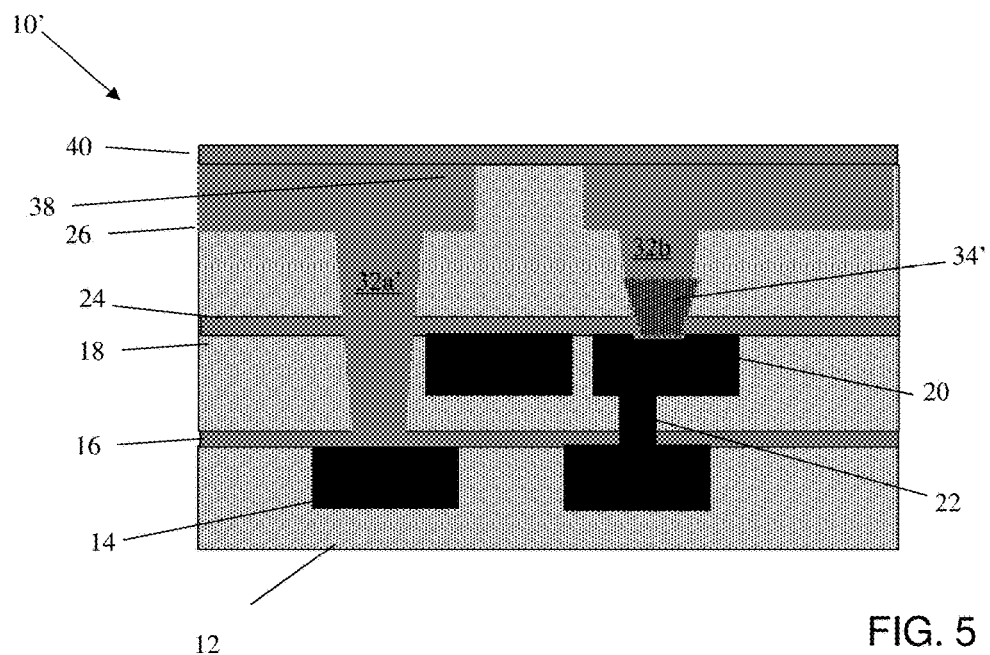
FIG. 5 shows an alternative structure and respective fabrication processes in accordance with additional aspects of the present disclosure.

FIG. 5 shows an alternative structure and respective fabrication processes in accordance with alternative aspects of the present disclosure. In this embodiment, a protective material will remain in the trench 32b during subsequent trench and via fill processes, e.g., metallization processes. For example, starting from the structure shown in FIG. 1, in the structure 10' of FIG. 5, a layer of protective material 34' can be deposited within the via 32b and on the exposed surface of the wiring structure 20. In embodiments, the protective material 34' will provide a protective mask during the skip via etching process as already described herein, which can be a metal, e.g., cobalt or ruthenium. The protective material 34' can be grown by a CVD or electroless processes to a thickness of about 10 nm to about 30 nm or more; although other dimensions are also contemplated herein which would provide protection to the wiring structure 20 during subsequent etching processes.

In this embodiment, the protective material 34' will remain in the via 32b in direct electrical connection with the wiring structure 20 on the M1 level. Following the via skip etching process which extends (deepens) the via 32a' to land on the wiring structure 14 on the lower level, e.g., M0 level, the resist and masking material can be removed by RIE and wet etching processes. As with the protective layer (e.g., sacrificial plug) 34, the protective material 34' will also protect the surface of the wiring structure 20 on the lower level, e.g., M1 level, during the removal of the masking material. After the removal of the masking material 28, the via 32a', remaining portion of the trench 32b and trenches 36 are filled with conductive material 38 to form dual damascene structures, e.g., interconnect structures and upper wiring structures.

As already noted herein, the interconnect structure formed in the via 32a' will be a skip via structure, electrically and directly connecting to wiring structure 14 on the lower M0 level, e.g., bypassing any connections in an upper M1 or above level. The conductive material 38 and protective material 34' in the via 32b, on the other hand, will be a regular trench/via interconnect structure, providing electrical and direct connection to the wiring structures 20 on the upper level. In embodiments, the conductive material can be copper, aluminum, tungsten, etc., to name a few contemplated materials, deposited by a conventional deposition method, e.g., CVD and/or plasma vapor deposition (PVD) and/or atomic layer deposition (ALD), followed by a conventional planarization process, e.g., CMP, to remove any residual material on the insulator layer 26. A capping layer 40 can then be formed over the insulator layer 26 and conductive material 38.

Figure 6:
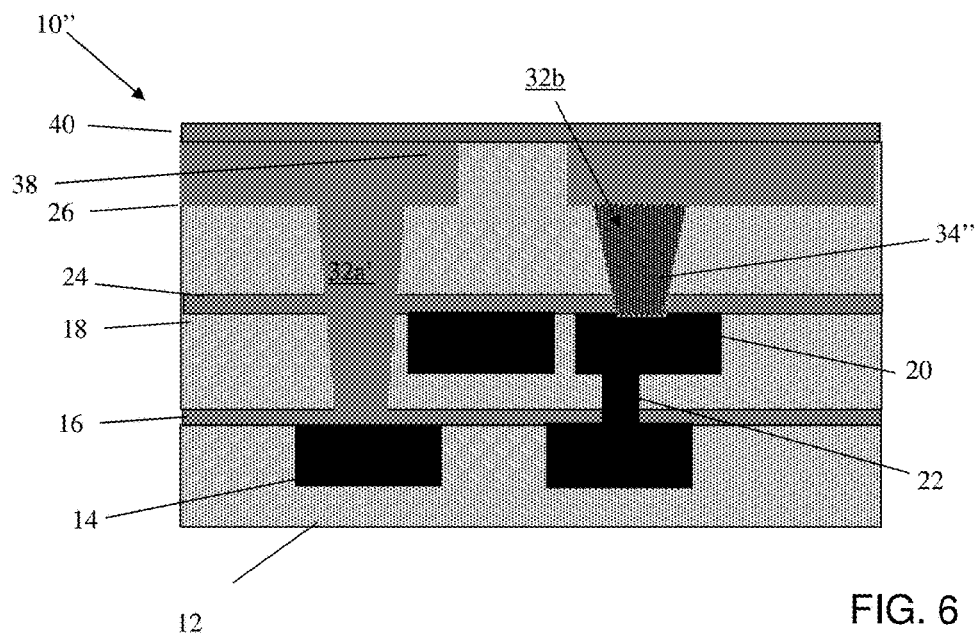
FIG. 6 shows an alternative structure and respective fabrication processes in accordance with additional aspects of the present disclosure.

FIG. 6 shows alternative structures and respective fabrication processes in accordance with alternative aspects of the present disclosure. In this embodiment, a protective material completely or substantially completely fills the via 32b, and will remain in the trench 32b during subsequent via fill and wiring formation. For example, starting from the structure shown in FIG. 1, in the structure 10" of FIG. 6, a protective material 34" fills the via 32b and is deposited in direct electrical connection with the exposed surface of the wiring structure 20. In this embodiment, the protective material 34" can also be a metal, e.g., cobalt or ruthenium, which acts as a protective mask during the skip via etching process as already described herein. The protective material 34" can be grown by a CVD or electroless processes to completely fill the trench 32b.

In this embodiment, the protective material 34" will remain in the via 32b in direct electrical connection with the wiring structure 20 on the upper level, e.g., M1 level. Following the via skip etching process which extends (deepens) the via 32a' to land on the wiring structure 14 on the lower level, e.g., M0 level, the resist and masking material can be removed by etching processes. As with the protective layer (e.g., sacrificial plug) 34, the protective material 34" will also protect the surface of the wiring structure 20 on the lower level during the formation (RIE process) of the trenches 36 and the wet removal of the masking material. After the removal of the masking material 28, the trench via and trenches 36 are filled with conductive material 38 to form dual damascene structures, e.g., interconnect structures and upper wiring structures.

As already noted herein, the interconnect structure formed in the via 32a' will be a skip via structure, electrically and directly connecting to wiring structure 14 on the M0 level, e.g., bypassing any connections in the M1 or upper metal level. The protective material 34" in the via 32b, on the other hand, will be a regular via interconnect structure, providing electrical and direct connection to the wiring structure 20 on the M1 level and an upper level formed by the conductive material 38. In embodiments, the metal material can be copper, aluminum, tungsten, etc., to name a few contemplated materials, deposited by a conventional deposition method, e.g., CVD and/or plasma vapor deposition (PVD) and/or atomic layer deposition (ALD), followed by a conventional planarization process, e.g., CMP, to remove any residual material on the insulator layer 26. A capping layer 40 can then be formed over the insulator layer 26 and conductive material 38.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a first wiring layer with one or more wiring structures;
   a second wiring layer with one or more wiring structures, located above the first wiring layer;
   a dual damascene skip via filled completely with a same metallization in both a via and trench of the dual damascene skip via, the dual damascene skip via bypasses and avoids contact to wiring structures on the second wiring layer, and makes direct electrical contact with the one or more wiring structures of the first wiring layer; and
   a dual damascene via structure extending to the one or more wiring structures at the second wiring layer and which comprises a protective plug in a via of the dual damascene via structure and the metallization in a trench of the dual damascene via structure, the metallization being directly on a surface of the protective plug, wherein the protective plug contacts and covers at least one of the one or more wiring structures at the second wiring layer which blocks the metallization from contacting the one or more wiring structures at the second wiring layer.

2. The structure of claim 1, wherein the protective plug is a metal.

3. The structure of claim 2, wherein the metal is one of cobalt and ruthenium.

4. The structure of claim 1, wherein the protective plug completely or substantially completely fills the via of the dual damascene via structure.

5. The structure of claim 4, wherein the metallization forms a wiring layer above and in contact with the protective plug above the via of the dual damascene via structure.

6. The structure of claim 1, wherein the protective plug partially fills the via of the dual damascene via structure.

7. The structure of claim 6, wherein the metallization fills remaining portions of the via of the dual damascene via structure, in contact with the protective plug.

8. The structure of claim 7, wherein the metallization is a wiring layer above and in contact with the via of the dual damascene via structure.

9. The structure of claim 6, wherein the protective plug is a metal.

10. The structure of claim 1, wherein the protective plug in the via of the dual damascene via structure is different than the one or more wiring structures at the second wiring layer.

11. The structure of claim 10, wherein the protective plug in the via of the dual damascene via structure is different than the metallization of the dual damascene skip via.

12. The structure of claim 11, wherein the protective plug in the via of the dual damascene via structure is different than the one or more wiring structures of the second wiring layer.

13. The structure of claim 12, wherein the protective plug in the via of the dual damascene via structure is in direct contact with the one or more wiring structures of the second wiring layer.

14. The structure of claim 12, wherein the protective plug in the via of the dual damascene via structure is a plug which is structured to protect the one or more wiring structures of the second wiring layer during an etching process to form a trench for the dual damascene skip via with metallization.

15. The structure of claim 14, wherein the protective plug in the of the dual damascene via via structure separates the one or more wiring structures of the second wiring layer and the one or more wiring structures at the second wiring layer.

16. The structure of claim 14, wherein the metallization is a wiring layer above and in contact with the via structure and wherein the dual damascene via structure extends only to the the one or more wiring structures on the second wiring layer.

17. The structure of claim 15, wherein the protective plug is a metal.

18. The structure of claim 1, wherein the dual damascene skip via passes through a capping layer on top of the first wiring layer with one or more wiring structures.

19. The structure of claim 18, wherein the capping layer is a diffusion barrier layer.

* * * * *

UNITED STATES PATENT AND TRADEMARK OFFICE
CERTIFICATE OF CORRECTION

PATENT NO.         : 10,262,892 B2
APPLICATION NO.    : 15/345882
DATED              : April 16, 2019
INVENTOR(S)        : Xunyuan Zhang et al.

Page 1 of 1

It is certified that error appears in the above-identified patent and that said Letters Patent is hereby corrected as shown below:

In Claim 15, Line 27 at Column 8, delete "via".
In Claim 16, Line 33 at Column 8, delete "the".

Signed and Sealed this
Twenty-fifth Day of June, 2019

Andrei Iancu
*Director of the United States Patent and Trademark Office*